United States Patent
Ruby et al.

(10) Patent No.: US 7,802,349 B2
(45) Date of Patent: Sep. 28, 2010

(54) MANUFACTURING PROCESS FOR THIN FILM BULK ACOUSTIC RESONATOR (FBAR) FILTERS

(75) Inventors: Richard C. Ruby, Menlo Park, CA (US); John D. Larson, Palo Alto, CA (US); Paul D. Bradley, Mountain View, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 542 days.

(21) Appl. No.: 11/748,970

(22) Filed: May 15, 2007

(65) Prior Publication Data

US 2009/0146531 A1   Jun. 11, 2009

Related U.S. Application Data

(62) Division of application No. 10/384,199, filed on Mar. 7, 2003, now Pat. No. 7,275,292.

(51) Int. Cl.
*H01L 41/22* (2006.01)
*H01L 41/00* (2006.01)

(52) U.S. Cl. .......... 29/25.35; 29/594; 29/846; 29/847; 310/321

(58) Field of Classification Search .......... 29/25.35, 29/594, 846, 847, 25.42; 310/321, 324, 348, 310/349, 363; 333/187, 189; 438/959; 427/100; 216/13, 38, 40, 41
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandis et al. | |

(Continued)

FOREIGN PATENT DOCUMENTS

DE   10160617   6/2003

(Continued)

OTHER PUBLICATIONS

U.S. Appl. No. 10/971,169, filed Oct. 22, 2004, Larson III, John D., et al.

(Continued)

*Primary Examiner*—Derris H Banks
*Assistant Examiner*—Tai Nguyen

(57) ABSTRACT

Method for fabricating an acoustical resonator on a substrate having a top surface. First, a depression in said top surface is generated. Next, the depression is filled with a sacrificial material. The filled depression has an upper surface level with said top surface of said substrate. Next, a first electrode is deposited on said upper surface. Then, a layer of piezoelectric material is deposited on said first electrode. A second electrode is deposited on the layer of piezoelectric material using a mass load lift-off process.

8 Claims, 14 Drawing Sheets

U.S. PATENT DOCUMENTS

| | | |
|---|---|---|
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa |
| 6,051,907 A | 4/2000 | Ylilammi |
| 6,060,818 A * | 5/2000 | Ruby et al. ................. 310/363 |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 * | 3/2001 | Yano et al. ................. 310/358 |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 * | 7/2002 | Ruby et al. ................. 333/187 |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Ylilammi et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,548,943 B2 | 4/2003 | Kaitila et al. |
| 6,549,394 B1 | 4/2003 | Williams |
| 6,550,664 B2 | 4/2003 | Bradley et al. |

| | | |
|---|---|---|
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,853,534 B2 | 2/2005 | Williams |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Andrzej |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson et al. |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson |
| 7,098,758 B2 | 8/2006 | Wang et al. |
| 7,102,460 B2 | 9/2006 | Schmidhammer et al. |
| 7,128,941 B2 | 10/2006 | Lee |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,242,270 B2 | 7/2007 | Larson et al. |
| 7,259,498 B2 | 8/2007 | Nakatsuka et al. |
| 7,275,292 B2 * | 10/2007 | Ruby et al. ................. 29/25.35 |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,332,985 B2 | 2/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,408,428 B2 | 8/2008 | Larson, III |
| 7,414,349 B2 | 8/2008 | Sasaki |
| 7,414,495 B2 | 8/2008 | Iwasaki et al. |
| 7,423,503 B2 | 9/2008 | Larson, III |
| 7,425,787 B2 | 9/2008 | Larson, III |
| 7,439,824 B2 | 10/2008 | Aigner |
| 7,545,532 B2 | 6/2009 | Muramoto |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 * | 12/2002 | Yamada et al. .............. 333/187 |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0124952 A1 | 7/2004 | Tikka |
| 2004/0129079 A1 | 7/2004 | Kato et al. |
| 2004/0150293 A1 | 8/2004 | Unterberger |

| | | | |
|---|---|---|---|
| 2004/0150296 A1 | 8/2004 | Park et al. | |
| 2004/0166603 A1 | 8/2004 | Carley et al. | |
| 2004/0195937 A1 | 10/2004 | Matsubara et al. | |
| 2004/0212458 A1 | 10/2004 | Lee | |
| 2004/0257171 A1 | 12/2004 | Park et al. | |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0012716 A1 | 1/2005 | Mikulin et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1 | 3/2005 | Nakatsuka et al. | |
| 2005/0057324 A1 | 3/2005 | Onishi et al. | |
| 2005/0068124 A1 | 3/2005 | Stoemmer | |
| 2005/0093396 A1 | 5/2005 | Larson et al. | |
| 2005/0093653 A1 | 5/2005 | Larson, III | |
| 2005/0093654 A1 | 5/2005 | Larson et al. | |
| 2005/0093655 A1 | 5/2005 | Larson et al. | |
| 2005/0093657 A1 | 5/2005 | Larson et al. | |
| 2005/0093658 A1 | 5/2005 | Larson et al. | |
| 2005/0093659 A1 | 5/2005 | Larson et al. | |
| 2005/0104690 A1 | 5/2005 | Larson | |
| 2005/0110598 A1 | 5/2005 | Larson, III | |
| 2005/0128030 A1 | 6/2005 | Larson et al. | |
| 2005/0140466 A1 | 6/2005 | Larson, III et al. | |
| 2005/0167795 A1 | 8/2005 | Higashi | |
| 2005/0193507 A1 | 9/2005 | Ludwiczak | |
| 2005/0206271 A1 | 9/2005 | Higuchi et al. | |
| 2005/0206483 A1 | 9/2005 | Pashby et al. | |
| 2005/0218488 A1 | 10/2005 | Mie | |
| 2006/0071736 A1 | 4/2006 | Ruby et al. | |
| 2006/0081048 A1 | 4/2006 | Mikado et al. | |
| 2006/0087199 A1 | 4/2006 | Larson et al. | |
| 2006/0103492 A1 | 5/2006 | Feng et al. | |
| 2006/0119453 A1 | 6/2006 | Fattinger et al. | |
| 2006/0125489 A1 | 6/2006 | Feucht et al. | |
| 2006/0132262 A1 | 6/2006 | Fazzlo et al. | |
| 2006/0164183 A1 | 7/2006 | Tikka et al. | |
| 2006/0185139 A1 | 8/2006 | Larson, III et al. | |
| 2006/0197411 A1 | 9/2006 | Hoen et al. | |
| 2006/0238070 A1 | 10/2006 | Costa et al. | |
| 2006/0284707 A1 | 12/2006 | Larson et al. | |
| 2006/0290446 A1 | 12/2006 | Aigner et al. | |
| 2007/0037311 A1 | 2/2007 | Izumi et al. | |
| 2007/0080759 A1 | 4/2007 | Jamneala et al. | |
| 2007/0084964 A1 | 4/2007 | John et al. | |
| 2007/0085447 A1 | 4/2007 | Larson | |
| 2007/0085631 A1 | 4/2007 | Larson et al. | |
| 2007/0085632 A1 | 4/2007 | Larson et al. | |
| 2007/0086080 A1 | 4/2007 | Larson et al. | |
| 2007/0086274 A1 | 4/2007 | Nishimura et al. | |
| 2007/0090892 A1 | 4/2007 | Larson | |
| 2007/0170815 A1 | 7/2007 | Unkrich | |
| 2007/0171002 A1 | 7/2007 | Unkrich | |
| 2007/0176710 A1 | 8/2007 | Jamneala et al. | |
| 2007/0205850 A1 | 9/2007 | Jamneala et al. | |
| 2007/0279153 A1 | 12/2007 | Ruby | |
| 2008/0055020 A1 | 3/2008 | Handtmann | |
| 2008/0297279 A1 | 12/2008 | Thalhammer et al. | |
| 2008/0297280 A1 | 12/2008 | Thalhammer et al. | |

FOREIGN PATENT DOCUMENTS

| | | |
|---|---|---|
| EP | 0231892 | 8/1987 |
| EP | 0637875 | 2/1995 |
| EP | 0689254 | 6/1995 |
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1100196 (A3) | 2/2002 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1557945 | 7/2005 |
| EP | 1575165 | 9/2005 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 06005944 | 1/1994 |
| JP | 2002/217676 | 8/2002 |
| JP | 2003/124779 | 4/2003 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AlN Film Using MOCVD for 5GHx Band FBAR Filter", *2003 IEEE Ultrasonics Symposium*, (Oct. 5, 2003),pp. 170-173.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Ruby, R. C., "Micro-Machined Thin Film Bulk Acoustic Resonators", *Proc. IEEE 48th, Symposium on Frequency control*, (1994),135-138.

Larson III, J. D., et al., "Measurement of Effective Kt2q,RpRs vs. Temperature for Mo/AlN/Mo Resonators", *2002 IEEE Ultrasonics Symposium, Munich, Germany*, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AIN Films", *IEEE Ultrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials for BAW Resonators and Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

"Examination Report corresponding to application No.", GB0605775.6, (Aug. 30, 2006).

Martin, Steven J., et al., "Development of a Low Dielectric Constant Polymer for the Fabrication of Integrated Circuit Interconnect", *12 Advanced Materials*, (Dec. 23, 2000),1769-1778.

Hadimioglu, B. et al., "Polymer Films As Acoustic Matching Layers"., *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Examination report corresponding to application No.", GB0605770.7, (Aug. 25, 2006).

"Examination Report from UK for application", GB 0605971.1, (Aug. 24, 2006).

"Search Report from corresponding application No.", GB 0605779.8, (Aug. 23, 2006).

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", Application No. GB0522393.8, (Jan. 9, 2006),4 pages.

"A partial copy of GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Sanchez, A.M. et al., "Mixed analytical and numerical design method for piezoelectric transformers", *IEEE,PESX*, (Jun. 2003),841-846.

Vasic, D et al., "A new MOSFET & IGBT Gate Drive Insulated by a Piezoelectric Transformer", *IEEE 32 nd Annual Power Electronics SPecialists Conference*, 2001 vol. 3, (Jun. 17-21, 2003),1479-1484.

Vasic, D et al., "A New Mothod to Design Piezoelectic Transformer Uned to MOSFET & IGBT Drive Circuits", *IEEE 34th ANuual Power Electronics Specialists Conference*, 2003 vol. 1, (Jun. 15-19, 2003),307-312.

Al-Ahmad, M. et al., "Piezoelectric-Based Tunable Microstrip Shunt Resonator", *Proceedings of Asia-Pacific Microwave Conference* 2006.

Lakin, K.M. , "Thin Film BAW Filters for Wide Bandwidth and High Performance Applications", *IEEE Microwave Symposium Digest*; vol. 2 Jun. 6-11, 2004 , 923-926.

Lakin, et al., "Wide Bandwidth Thin Film BAW Filters", *2004 IEEE Ultrasonics Symposium*, vol. 1, Aug. 2004 , 407-410.

\* cited by examiner

MANUFACTURING PROCESS FOR THIN FILM BULK ACOUSTIC RESONATOR (FBAR) FILTERS

CROSS-REFERENCE TO RELATED APPLICATIONS

The present application is a divisional patent application under 37 C.F.R. §1.53(b) of U.S. patent application Ser. No. 10/384,199 and filed on Mar. 7, 2003 now U.S. Pat. No. 7,275,292. Priority is claimed under 35 U.S.C. §121 from this application. The present application is also related to U.S. patent application Ser. No. 10/994,068 to Ruby, et al. and filed on Nov. 18, 2004. The entire disclosures of the noted related applications are specifically incorporated herein by reference.

FIELD OF THE INVENTION

The present invention relates generally to acoustic resonators, and more particularly, to resonators that may be used as filters for electronic circuits and a method of manufacturing the same.

BACKGROUND OF THE INVENTION

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 microns in diameter and few microns in thickness.

At the heart of Thin Film Bulk Acoustic Resonators (FBARs) and Stacked Thin Film Bulk Wave Acoustic Resonators and Filters (SBARs) is a thin sputtered piezoelectric film having a thickness on the order of one to two microns. Electrodes on top and bottom sandwich the piezoelectric acting as electrical leads to provide an electric field through the piezoelectric. The piezoelectric, in turn, converts a fraction of the electric field into a mechanical field. A time varying "stress/strain" field will form in response to a time-varying applied electric field.

To act as a resonator, the sandwiched piezoelectric film must be suspended in air to provide the air/crystal interface that traps the sound waves within the film. The device is normally fabricated on the surface of a substrate by depositing a bottom electrode, the PZ layer, and then the top electrode. Hence, an air/crystal interface is already present on the topside of the device. A second air/crystal interface must be provided on the bottom side of the device.

A publication entitled, "Bulk Acoustic Resonators and Filters for Wireless Applications," by K. Lakin, State-of-the-Art Filter Design Using EM and Circuit Simulation Techniques, 2001 IEEE International Microwave Symp. Workshop Notes, MTT-8, Filters and Passive Components, May 20, 2001, describes the general features of thin film resonator (TFR) technology.

There are basically two types of thin film resonators (TFRs): the membrane type and the mirror type. The mirror type is also referred to as a solidly mounted resonator (SMR). The membrane type of TFR has an advantage over the SMR type in that the membrane type of TFR has a better energy confinement due to the air interface on both sides of the piezolayer. The improved energy confinement enables higher coupling coefficients that lead to larger filter bandwidth.

Unfortunately, the fabrication of these membrane structures is very complex. The challenges in the manufacturing process for these types of structures include 1) depositing multiple films with severe constraints on smoothness; 2) being able to accurately measure and monitor the thickness of each layer (especially multiple layers; 3) manufacturing a high-volume, high throughput process that is amenable to multiple depositions in one process step. This last step is important when planning for capacity; 4) finding compatible metals, piezoelectric materials, and the release material, 5) very thin (~0.5 micrometer) AlN dielectric layer leading to electro-static breakdown problems; 6) providing robust anchor points for the suspended membranes without introducing significant acoustic energy drain (lowers device Q); 7) aligning the various layers so that there are no "ghost" FBAR segments that might resonate at slightly different frequencies. For these reasons, the state of the art for manufacturing thin film resonators has opted for the SMR structure over the membrane type of structure.

There are numerous publications that describe different aspects of the manufacture of SMR structures. For example, a publication entitled, "ZnO Based Thin Film Bulk Acoustic Wave Filters for EGSM Band" by J. Kaitila, M. Ylilammi, J. Molarius, J. Ella, and T. Makkonen, Ultrasonics Symposium 2001 describes ZnO based filters that have a solidly mounted resonator structure.

Another publication entitled, "Temperature Compensated Bulk Acoustic Thin Film Resonators" by K. M. Lakin, K. T. McCarron, and J. F. McDonald, 2000 IEEE Ultrasonics Symp. Proc., pp. 855-858, Oct. 22-25, 2000, Caribe Hilton, San Juan, Puerto Rico, describes temperature compensated TFRs that have a solidly mounted resonator structure.

Another publication entitled, "Filter Banks Implemented with Integrated Thin Film Resonators" by K. M. Lakin, K. T. McCarron, J. Belsick and R. Rose, 2000 IEEE Ultrasonics Symp. Proc., pp. 851-854, Oct. 22-25, 2000, Caribe Hilton, San Juan, Puerto Rico, describes filter banks with TFR that have a solidly mounted resonator structure.

Based on the foregoing, there remains a need for a process to manufacture acoustic resonators that overcomes the disadvantages set forth previously.

SUMMARY OF THE INVENTION

According to one embodiment of the present invention, a method for fabricating an acoustical resonator on a substrate having a top surface is described. First, a depression in said top surface is generated. Next, the depression is filled with a sacrificial material. The filled depression has an upper surface level with said top surface of said substrate. Next, a first electrode is deposited on said upper surface. Then, a layer of piezoelectric material is deposited on said first electrode. A second electrode is deposited on the layer of piezoelectric material using a mass load lift-off process.

According to a second embodiment of the present invention, the second electrode is patterned by utilizing a photo resist mask. The hard mask layer is deposited after the second electrode layer. The hard mask is then patterned, and the patterned hard mask is subsequently employed to etch the second electrode. The hard mask serves also as a passivation layer.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A manufacturing process for thin film bulk acoustic resonator (fbar) filters is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

General Processing Flow and Structure

Figure 1:
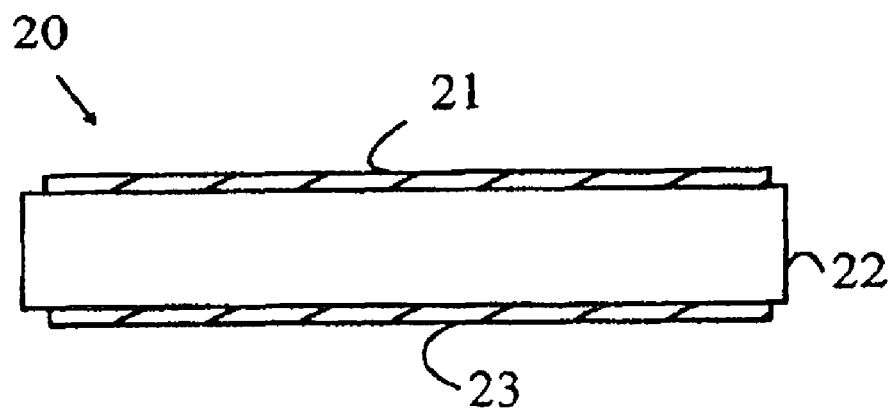
FIG. 1 is a cross-section of FBAR resonator.
Figure 2:
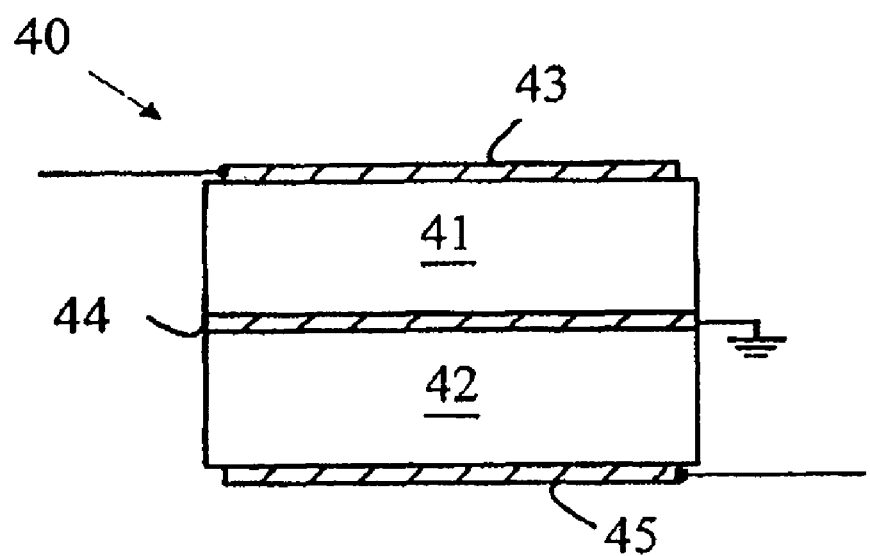
FIG. 2 is a cross-section of an SBAR resonator.

The present invention may be more easily understood with reference to FIGS. 1 and 2, which are cross-sectional views of an FBAR and an SBAR, respectively. Referring to FIG. 1, FBAR 20 includes bottom and top electrodes 23 and 21, respectively, which sandwich a portion of a sheet of piezoelectric (PZ) material 22. The preferred PZ material is aluminum nitride (AlN). The electrodes used in resonator 20 are preferably made of Molybdenum (Mo). However, in other embodiments, the electrodes can be manufactured with other materials, such as, but not limited to, Tungsten (W), Gold (Au), Titanium (Ti), Aluminum (Al), Platinum (Pt), Vanadium (V), Copper (Cu), and Titanium Nitride (TiN).

These devices use bulk longitudinal acoustic waves in the thin film PZ material. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions of the order of 100 microns and few microns in thickness.

Referring now to FIG. 2, which is a cross-sectional view of an SBAR 40. An SBAR provides electrical functions analogous to those of a band-pass filter. SBAR 40 basically includes two FBAR filters that are mechanically coupled. A signal across electrodes 43 and 44 at the resonance frequency of PZ layer 41 transmits acoustical energy to PZ layer 42. The mechanical oscillations in PZ layer 42 are converted to an electrical signal across electrodes 44 and 45 by the PZ material.

The manner in which an FBAR and SBAR are constructed according to the present invention may be more easily understood with reference to FIGS. 3-7, which are cross-sectional views of a portion of a wafer 101 on which an FBAR 110 is constructed by the method of the present invention. The present invention utilizes a sacrificial layer comprising a material that is much more easily etched than the thermal oxides utilized in prior art methods based on sacrificial layers. In the preferred embodiment of the present invention, the sacrificial layer is constructed from phosphor-silica-glass (PSG).

Figure 3:
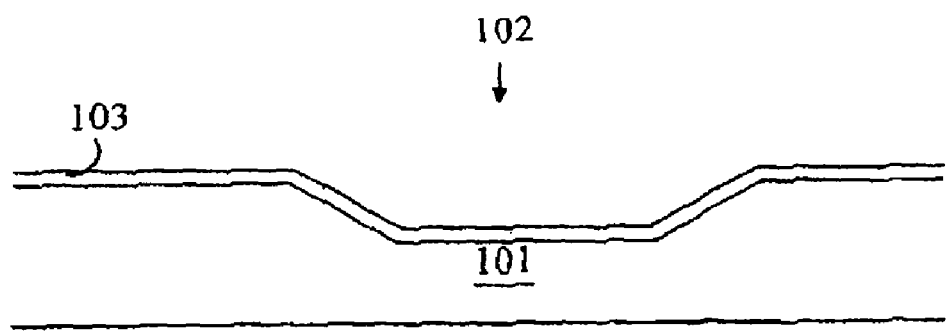
FIGS. 3-7 are cross-sectional views of a portion of a wafer on which an FBAR is constructed by a general processing method according to one embodiment of the present invention.

Referring to FIG. 3, a pit 102 is etched into substrate 101, which is preferably a conventional silicon wafer of the type utilized in integrated circuit fabrication. The pit is preferably less than 30 microns. It should be noted that the depth of the cavity under the FBAR needs to be only sufficient to accommodate the displacement created by the piezoelectric layer. Hence, a pit having a depth of a few microns is sufficient.

A thin layer of thermal oxide 103 is grown on the surface of the wafer to prevent phosphorous from the PSG from diffusing into the layer. Such diffusion would convert the silicon to a conductor, which would interfere with the electrical operation of the final device.

Figure 4:
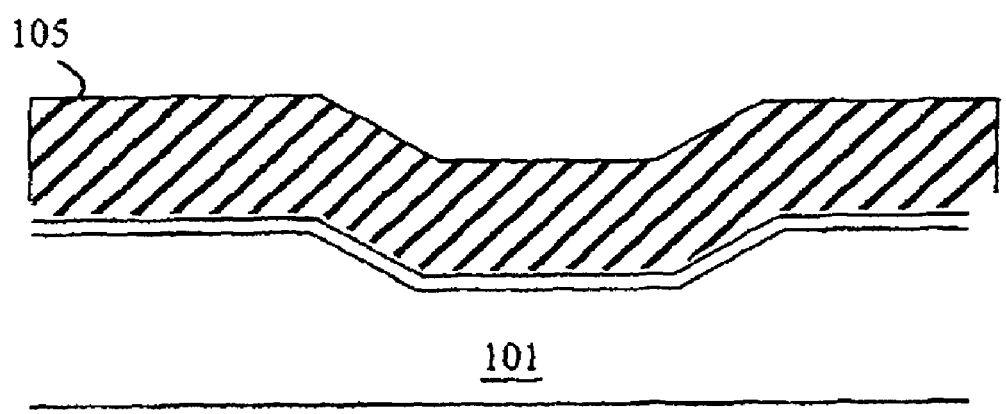

Referring to FIG. 4, a PSG layer is then deposited over the wafer. The PSG is deposited at a temperature of about 450 degrees Celsius using a silane and $P_2O_5$ sources to form a soft glass like material, which is approximately 8% phosphorous. This low temperature process is well known to those skilled in the art, and hence, will not be discussed in detail here. The PSG is the preferred choice for a sacrificial layer because it is a very clean, inert material that can be deposited at the relatively low temperature and can be etched in a dilute $H_2O$:HF solution at a very high etch rate. At a dilution ratio of 10:1, etch rates on the order of 3 microns per minute are obtained.

Unfortunately, a native PSG sacrificial layer is a poor base for constructing an acoustical resonator. At the atomic level the surface of such deposited films are atomically very rough. An acoustical resonator of the FBAR/SBAR type requires a piezoelectric material in which the crystals grow in columns that are perpendicular to the plane of the electrodes. Attempts to grow well-collimated piezoelectric films on the surface of a PSG layer result, at best, in poor polycrystalline material that exhibits little or no piezoelectric effects because the many facets on the rough surface initiate crystal growth in a variety of directions.

Figure 5:
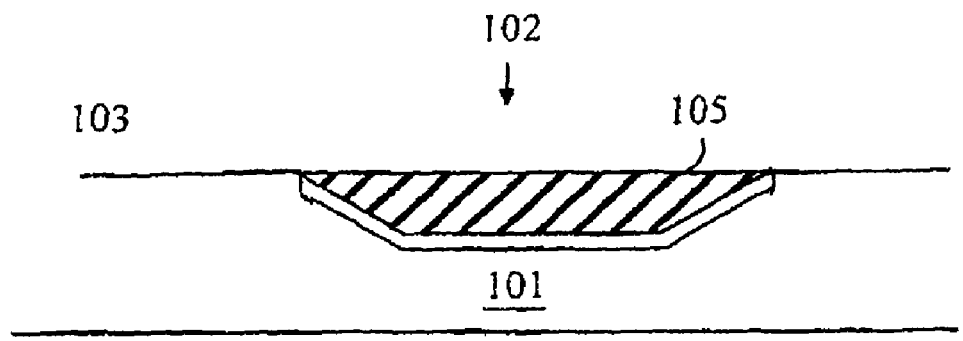

The present invention overcomes this difficulty by polishing the PSG surface to provide an atomically smooth surface. Referring to FIG. 5, the surface of the PSG layer 105 is first planarized by polishing with a slurry to remove the portion of the PSG layer and oxide outside of pit 102. The remaining PSG can then be polished using a more refined slurry. Alternatively, a single more refined slurry can be used for both polishing steps if the additional polishing time is not objectionable. The goal is to create a "mirror" like finish.

The cleaning of these wafers is also important part of the processing steps of the present invention. The slurry leaves bits of silica grit on the wafer. This grit is preferably removed. In the preferred embodiment of the present invention, this is accomplished by using a second polishing wheel with a stiff, hard pad such as Polytex™ (Rodel, Conn.) De-ionized water is used as the lubricant. After being polished, the wafers are kept in de-ionized water until ready for the final cleaning step. The wafers should not be allowed to dry between the last polish step and the last cleaning step. The last cleaning step consists of dipping the wafers in a series of tanks that hold various chemicals. Each tank is subjected to ultrasonic agitation. Such cleaning benches are well known to the art, and hence, will not be discussed in detail here. A cleaning bench of the Megasonic™ type available from Ameramade, Calif. has been found to be adequate.

The present invention is based on the surprising finding that such a smooth surface provides a base for the deposition of highly textured c-axis piezoelectric material demonstrating excellent piezoelectric properties in spite of the fact that it does not contain a crystalline structure that "seeds" the piezoelectric layer.

The grit consists of silica particulates. In the preferred embodiment of the present invention, a slurry made by Rodel (#1508), which is an ammonia-based slurry of silica particulates, is utilized.

While the above discussion has indicated a specific polishing and cleaning regime, any polishing and cleaning regime which provides a surface of the requisite smoothness may be utilized. In the preferred embodiment of the present invention, the final surface has a RMS (root-mean-squared) variation in height of less than 0.5 microns as measured with an atomic force microscope probe.

Figure 6:
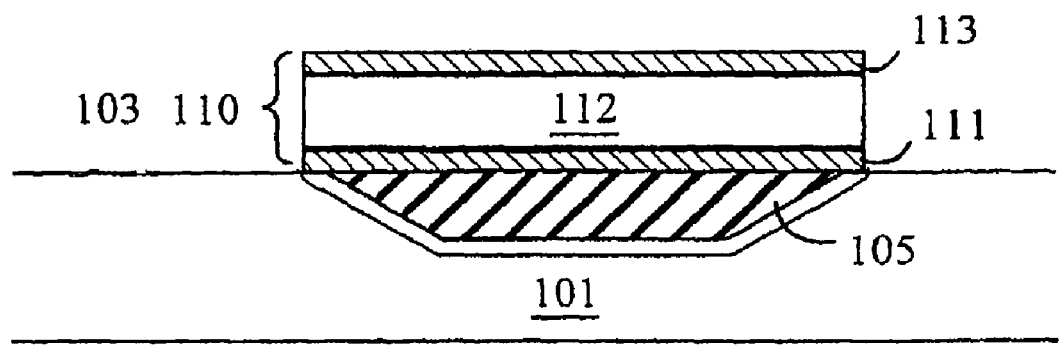

After the surface is cleaned, the bottom electrode 111 of the FBAR 110 is deposited as shown in FIG. 6. The preferred electrode material is molybdenum. However, other materials will be apparent to those skilled in the art. For example, the electrodes may be constructed from Al, W, Au, Pt, or Ti. Molybdenum is preferred because of its low thermo-elastic loss, and etch compatibility with AlN. For example, Mo has approximately 56 times less thermo-elastic loss than Al.

After the bottom electrode has been deposited, the piezoelectric layer 112 is deposited. The preferred material for the piezoelectric layer is AlN, which is also deposited by sputtering. Since the deposition of AlN to form a piezoelectric layer is well known in the art, this deposition process will not be discussed in detail here. In the preferred embodiment of the present invention, the piezoelectric layer has a thickness between 0.1 and 10 microns.

Finally, the top electrode 113 is deposited. The top electrode is also preferably constructed from Mo.

Figure 7:
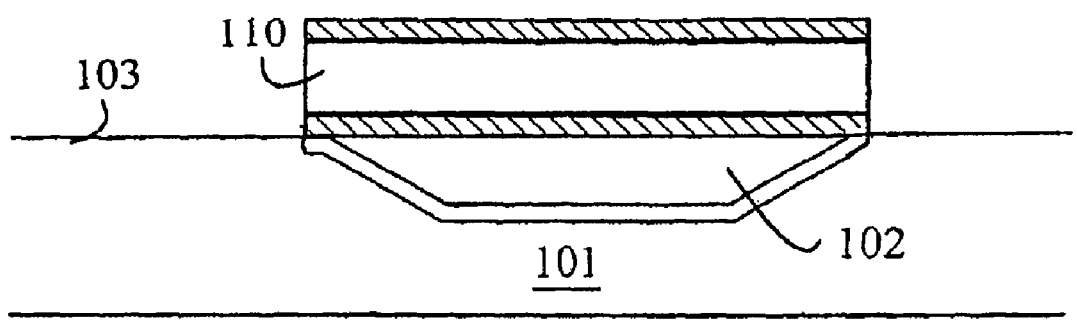

After the FBAR structure is deposited, vias are opened to the underlying sacrificial layer 105 and the PSG removed by etching in dilute $H_2O$:HF solution as shown in FIG. 7. This leaves FBAR 110 suspended over the original pit 102.

The above example has utilized the construction of an FBAR. However, it will be obvious to those skilled in the art from the preceding discussion that an SBAR can be constructed utilizing the same process. In the case of an SBAR, an additional piezoelectric layer and electrode must be deposited. Since the second piezoelectric layer is constructed on the top electrode of the FBAR, the thickness of the top electrode should be selected to provide a suitable surface for depositing the second piezoelectric layer.

While the above-described embodiments of the present invention utilize a sacrificial layer constructed from PSG, other materials may also be used. For example, other forms of glass such as BPSG or spin-on-glass may be utilized. In addition, there are plastics such as polyvinyl, polypropylene and polystyrene that can be deposited either by spinning on the material or depositing in special chambers. These sacrificial layers can be removed using an organic stripper or $O_2$ plasma etch. As with the PSG sacrificial layer, polishing is also crucial with these materials, as the surfaces of these materials as deposited are not atomically smooth.

Processing Steps

Figure 8:
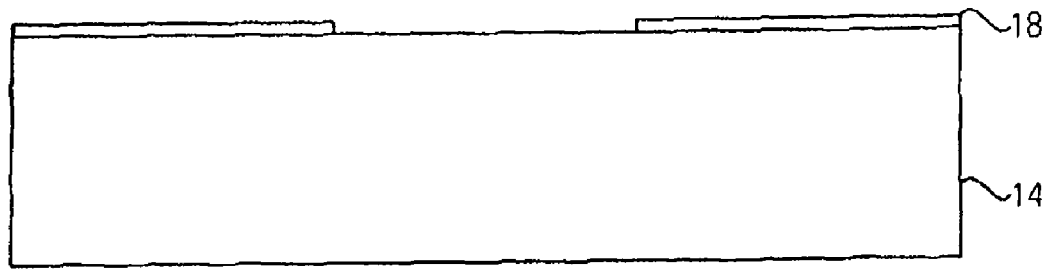
FIGS. 8-28 are cross-sectional views of a portion of a wafer on which an FBAR is constructed according to another embodiment of the present invention.

FIGS. 8-30 are cross-sectional views of a portion of a wafer on which an FBAR is constructed according to a first preferred embodiment of the present invention. Referring to FIG. 8, the starting material is a non-conductive substrate (hereinafter also referred to as a high resistivity substrate) 14. Preferably, the starting material is a high resistivity float zone silicon substrate 14. However, other materials of high resistivity, such as gallium arsenide (GaAs) may also be utilized. A first mask 18 for use in etching a depression (hereinafter also referred to as a swimming pool) is also shown. The first mask 18 is preferably a dark field mask that includes positive photo resist.

Figure 9:
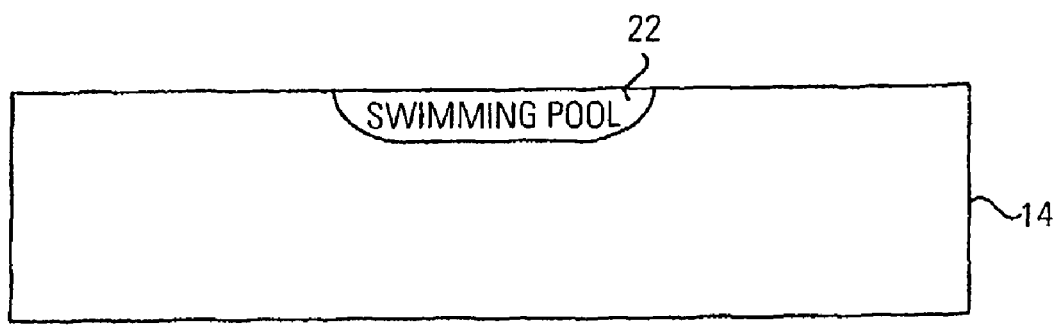

Referring to FIG. 9, a depression 22 or "swimming pool" is etched into the substrate 14. Preferably, a dry etch is utilized to each the depression 22. Any remaining photo resist of the first mask 18 is stripped. The ultimate purpose of the depression 22 is to provide for the suspension of a piezoelectric membrane over air.

Figure 10:
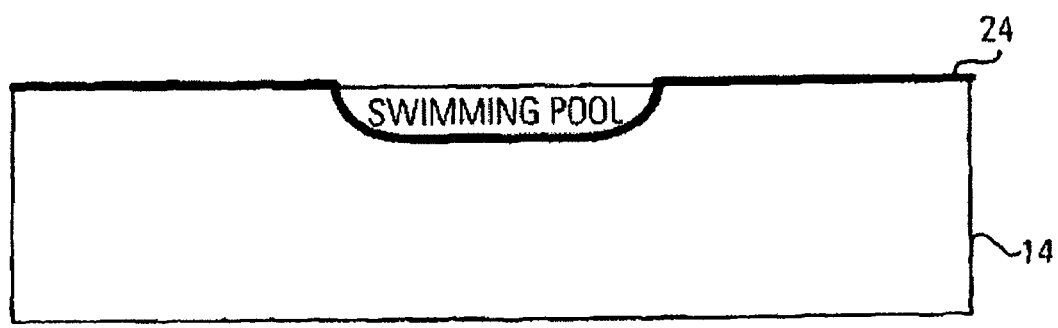

Referring to FIG. 10, a barrier layer 24 is formed on the top surface of the substrate 14. Preferably, the barrier layer 24 is thermal oxide having a thickness of about 2000 Angstroms. The barrier layer 24 prevents the diffusion of dopants, which are included in the material that is deposited in the next step, into the silicon substrate 14. This diffusion of dopants, if not prevented, would make the silicon surface conductive, thereby shunting the RF signal from the Film Bulk Acoustic Resonator (FBAR).

Figure 11:
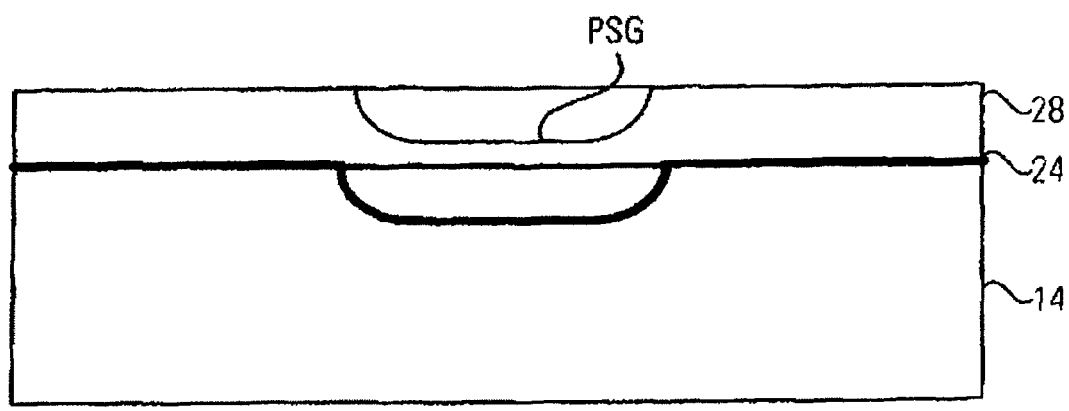

Referring to FIG. 11, a sacrificial layer phosphorous-doped silica glass (PSG) 28 is deposited on the barrier layer 24. The sacrificial layer 28 acts as a support material by which the membrane structure may be processed. The sacrificial layer is preferably a phosphorous-doped silicon glass (PSG) 28. Preferably, a 0% to 8% phosphorous silicon glass is deposited onto the wafer at about 400 degrees to 600 degrees. It is noted that phosphorous doping of PSG 28 affects the speed at which the material 28 etches is a dilute HF bath. As described in greater detail hereinafter, the swimming pool 22 is subsequently relieved of the material 28 by an etch step to leave air in the swimming pool 22.

Figure 12:
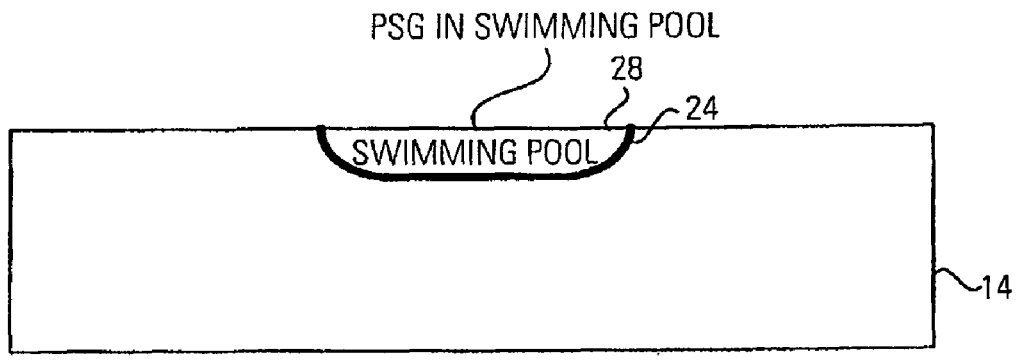

Referring to FIG. 12, a chemical mechanical polish (CMP) is performed on the surface to planarize the surface, thereby removing both the barrier layer 24 and the sacrificial layer 28 from the surface of the substrate. This step leaves the barrier layer 24 and the sacrificial material (PSG) 28 only in the depression 22. This step is described in greater detail in U.S. Pat. No. 6,060,818 entitled, "SBAR structures and method of fabrication of SBAR/FBAR film processing techniques for the manufacturing of SBAR/BAR filters," by Richard C. Ruby, Yogesh Desai, and Donald R. Bradbury.

Figure 13:
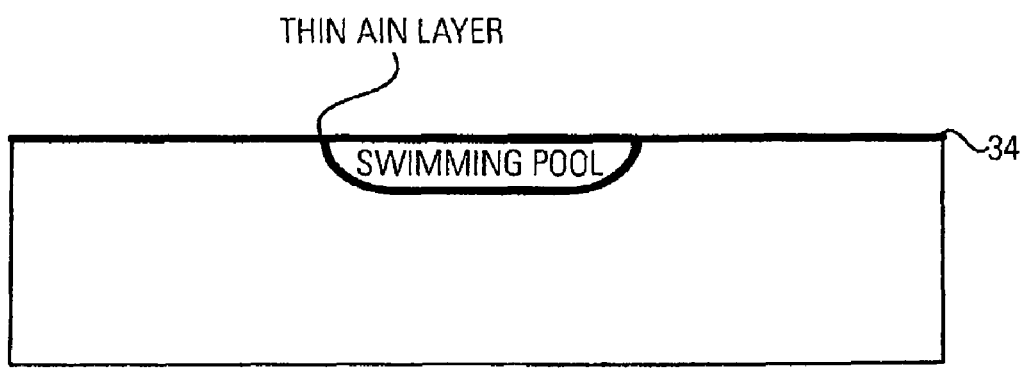

Referring to FIG. 13, a barrier layer 34 (also referred to as a seed layer) of aluminum nitride (AlN) or other suitable material, such as TiN, is then deposited on the polished surface using evaporation or other deposition process. Preferably, the seed layer 34 includes an aluminum nitride (AlN) layer having a thickness of several hundred Angstroms (e.g., about 300 Angstroms).

Figure 14:
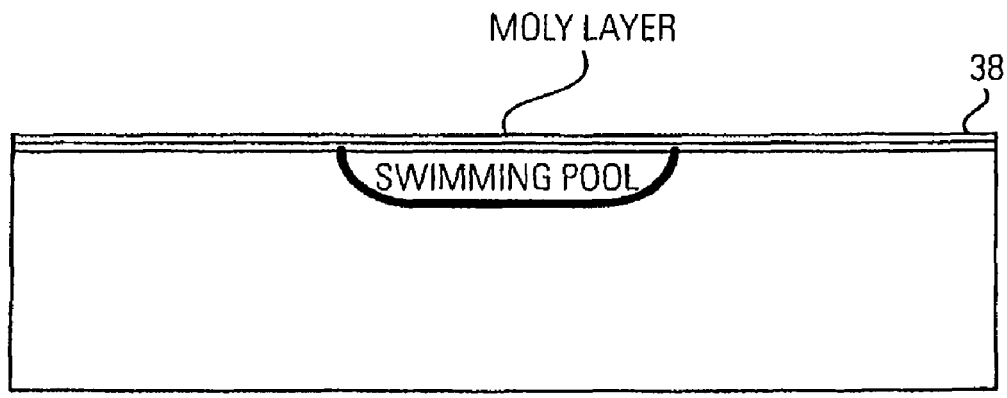

Referring to FIG. 14, a bottom electrode 38 is fabricated by depositing a suitable conductor upon the seed layer 34 by evaporation or other deposition process that produces a layer of conducting material. Preferably, the bottom electrode 38 is formed from a conductive material, such as molybdenum (hereinafter referred to as Mo or moly).

The bottom electrode 38 acts as the bottom electrical contact to the Aluminum Nitride (AlN) acoustic stack. Preferably, the bottom electrode 38 has a thickness in the range of about 1000 Angstroms to about 1 micron.

Figure 15:
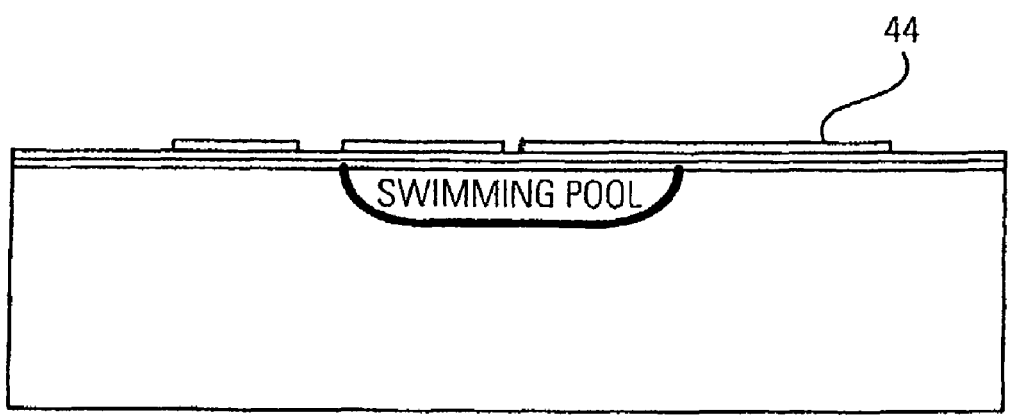

Referring to FIG. 15, a second mask 44 is utilized for patterning the bottom of the FBAR membrane stack and the lead connecting to the contact pads. The second mask 44 defines the bottom contact pad pattern and part of the FBAR stack lateral geometry. The stack geometry controls lateral modes and device capacitance.

Figure 16:
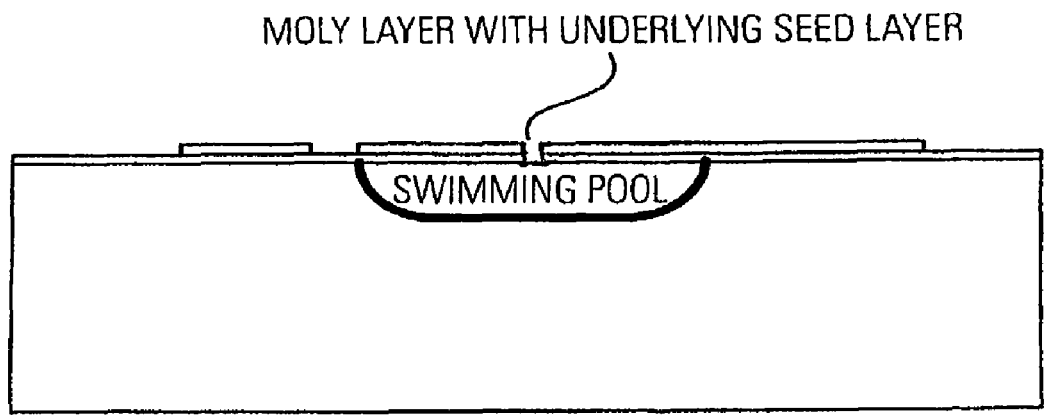

Referring to FIG. 16, portions of the layer of conducting material 38 and a seed layer 34 are then removed by etching or other means, so as to leave the desired pattern of conducting material as the bottom electrode (i.e., patterned seed layer 34 and conducting material layer 38. After the bottom electrode 38 and seed layer 34 are etched, the remaining photoresist is removed (e.g., stripped).

Figure 17:
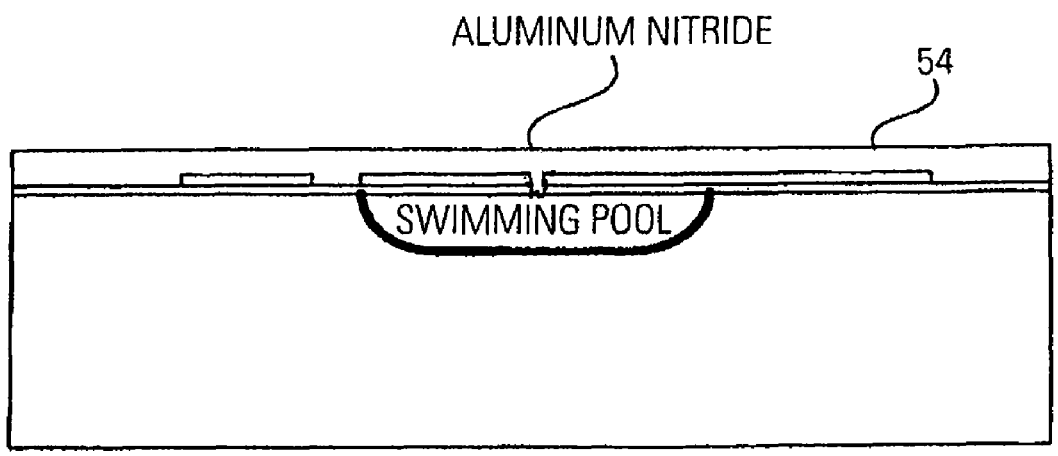

Referring to FIG. 17, a resonating layer 54 is deposited. Preferably, the resonating layer 54 is made from a piezoelectric mono-crystalline resonating material, such as aluminum nitride (AlN). The resonating layer 54 preferably has a thickness in the range of about 1000 Angstroms to about 4 micron.

Figure 18:
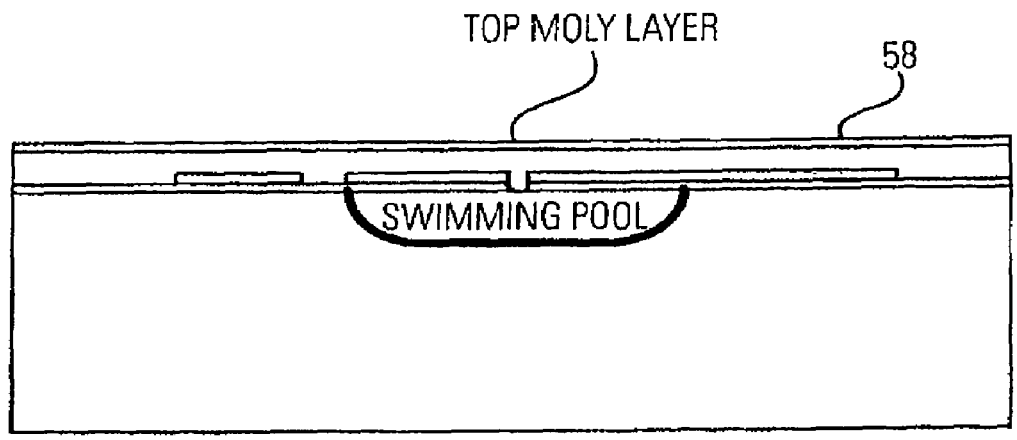

Referring to FIG. 18, a top electrode 58 is deposited and patterned. The top electrode is also preferably constructed from Molybdenum (Mo). The top electrode defines the top contact metal leads to the acoustic stack.

It is known by those of ordinary skill in the art that filter design requires resonators with different frequencies (e.g., resonators of at least two different frequencies). Two commonly utilized filter topologies include a half-ladder design and a lattice design. These designs, for example, can employ a series filter and a shunt filter that typically has a lower frequency than the series filter. The series filter is typically coupled to the output node, and the shunt filter is typically coupled to ground potential.

The processing up to this point, is the same for shunt resonators and series resonators. However, at this point in the processing, mass loading is employed according to the invention to differentiate between shunt resonators and series resonators. In particular, mass loading is employed according to the invention to add mass to the shunt resonator to lower the frequency of the shunt resonator relative to the series resonator. These process steps are referred to herein as "mass loading" processing steps.

Figure 19:
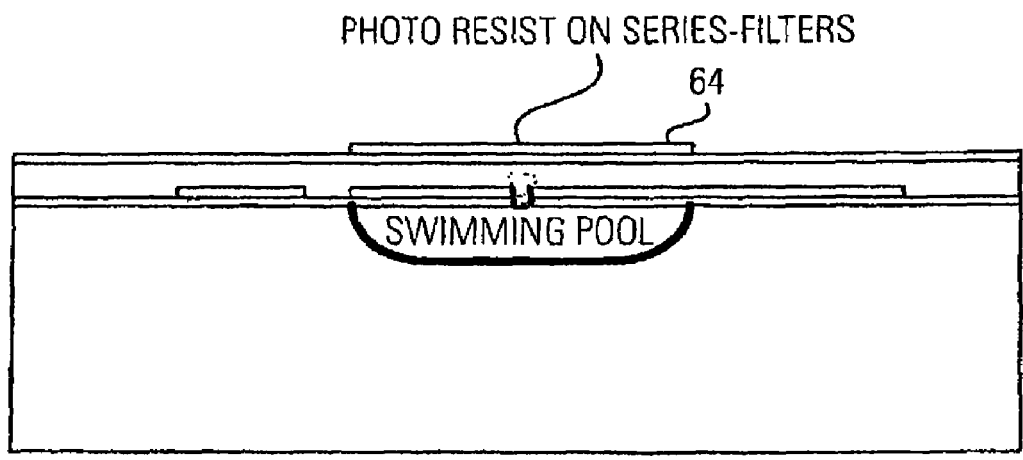

Referring to FIG. 19, the third mask 64 defines a mass load pattern. The third mask 64 is preferably a dark field mask that includes positive photo resist. The third mask 64 for defining a mass load pattern is applied to the top electrode 58. For example, the third mask 64 can include photo resist that is applied to the top electrode 58 except on the shunt filters.

As noted previously, the processing of the shunt resonators involve mass loading, while the processing of series resonators do not involve mass loading. The mass load pattern for the shunt filter component has more mass by the amount of Mo to be deposited in the next step. The more mass allows the shunt filters to resonate at a different frequency than the series filters as discussed previously.

Figure 20:
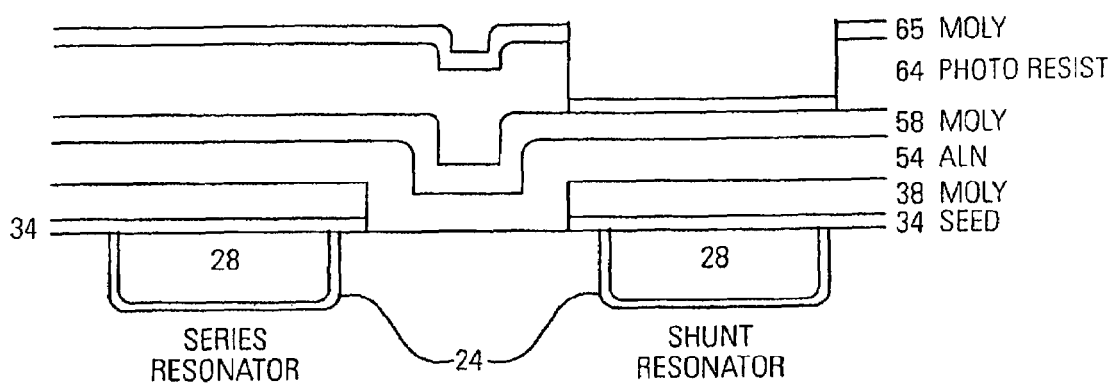
Figure 21:
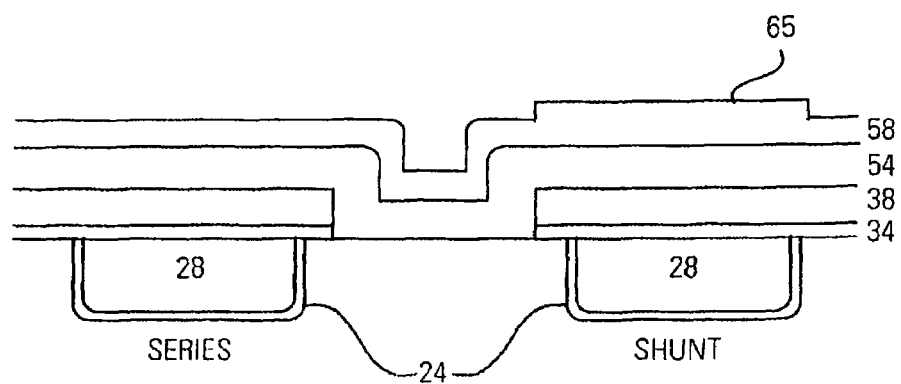

FIGS. 20 and 21 illustrate mass loading process steps in accordance with one embodiment of the invention. Referring to FIG. 20, mass loading layer 65 is deposited on the third mask 64 with the mass load pattern. Referring to FIG. 21, lift-off of the mass loading is performed. A lift-off technique is employed in order to reduce the possibility of altering the mass of the bypass filter either by attacking it or leaving a residue after etching. Referring again to FIG. 21, after etching, a portion 65 of the mass loading layer above the shunt resonator remains, while the mass loading portion above the series resonator is etched away.

Figure 22:
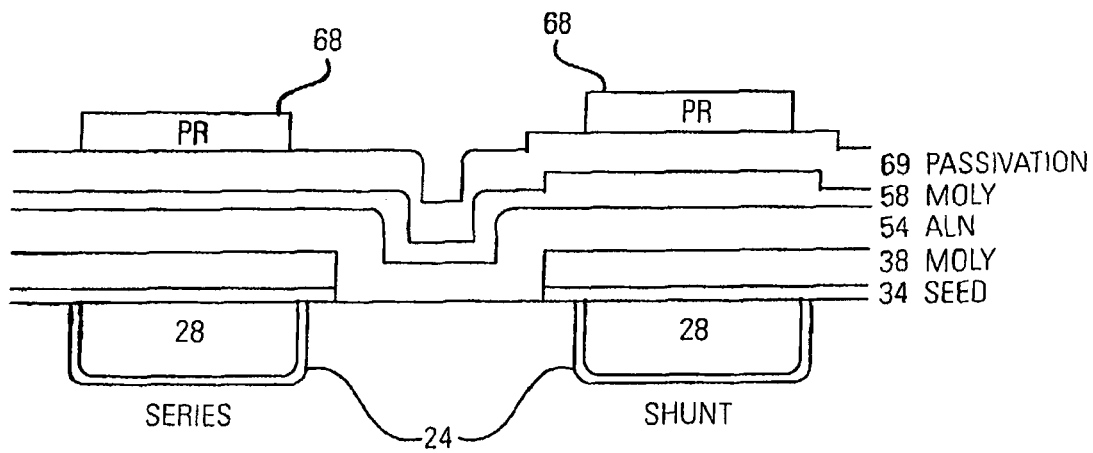

Referring to FIG. 22, a "capping" layer or passivation layer 69 is deposited over the whole wafer. Specifically, after the processing step of lift-off of the mass loading (see FIG. 21), a capping layer 69 may be deposited. A mask 68 is then utilized to pattern and etch the capping layer 69. The capping layer 69 can be, for example, but is not limited to AlN, TiN, silicon, chrome, silicon nitride (Si3N4) or any other suitable material or combination of materials. The purpose of this "capping layer" 69 is to form a passivation layer.

If the capping layer 69 is deposited prior to the patterning of the top electrode (e.g., a Mo electrode), this layer 69 can also act as a "hard mask" for use in etching the top electrode. Since photoresist is known to recede (or pull back) during long dry etches, this hard mask 69, which is made from a material different from photoresist, can be employed to achieve a very accurate area definition, thereby providing an advantage over the use of photoresist. An accurate area definition is important since the area of the top electrode defines the impedance of the device.

Referring again to FIG. 22, a chlorine gas may be utilized to etch the hard mask (i.e., the passivation layer 69). The $SF_6$ gas may then used to etch the top electrode (e.g., top Mo electrode). In this manner, a separate photoresist mask is not needed.

In the preferred embodiment, the mask 68 (e.g., a photoresist mask pattern 68) is employed to first pattern the capping layer 69 into a hard mask. The hard mask 69 is the utilized as a mask to pattern the top electrode layer 58. The mask 68, hard mask 69, and top electrode 58 are then etched away.

Figure 23:
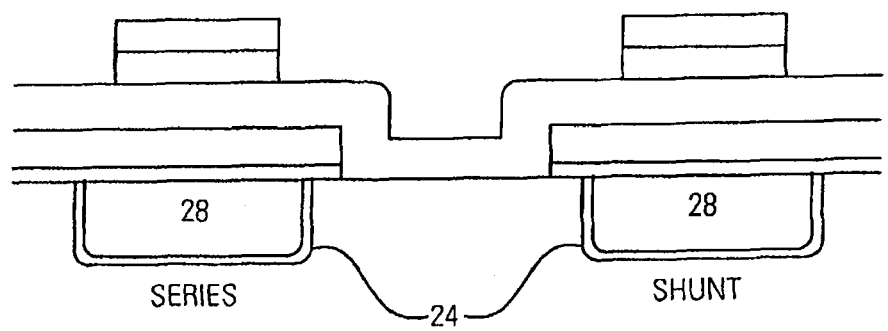

FIG. 23 shows the profile of the resonator stacks after the hard mask etch and the top electrode etch. It is noted that the thickness of the top Mo layer over the series resonator is slightly less than the thickness of the top Mo layer over the shunt resonator.

Figure 23A:
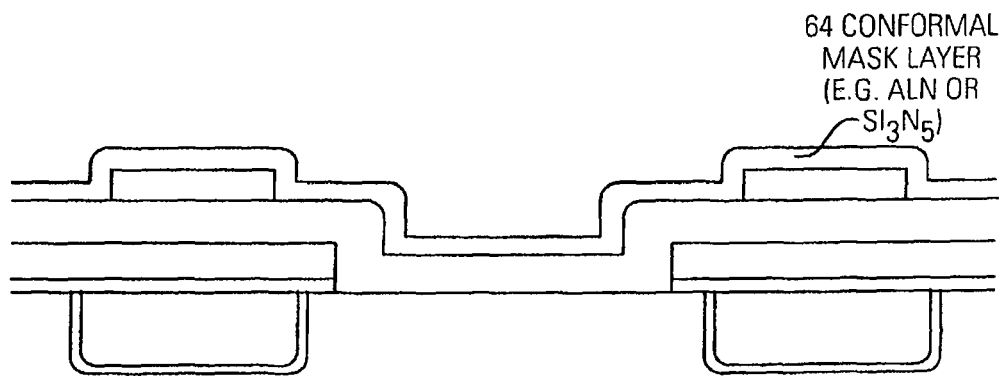

Referring to FIG. 23A, in an alternative embodiment, the passivation layer 69 is first patterned and then the top electrode (e.g., the top Mo electrode) for both series and shunt resonators are etched. A blanket layer of passivation 46 (herein referred to as a conformal passivation layer) is then deposited. The conformal passivation layer 46 is an insulator and is preferably aluminum nitride AlN or silicon nitride. This conformal passivation layer 46 can be patterned simultaneously with the patterning of the thick piezo electric layer (e.g., an AlN layer 54 described hereinbelow).

In another embodiment, the processing after depositing the AlN layer 54, deposits a Mo layer everywhere. Then, the AlN layer 54 and the Mo layer are patterned and etched by employing a layer of photoresist that protects the Mo over the shunt resonator areas. A dry etch can be utilized to remove the Mo from the series resonator areas. The top electrode 58 is then deposited and patterned.

Figure 24:
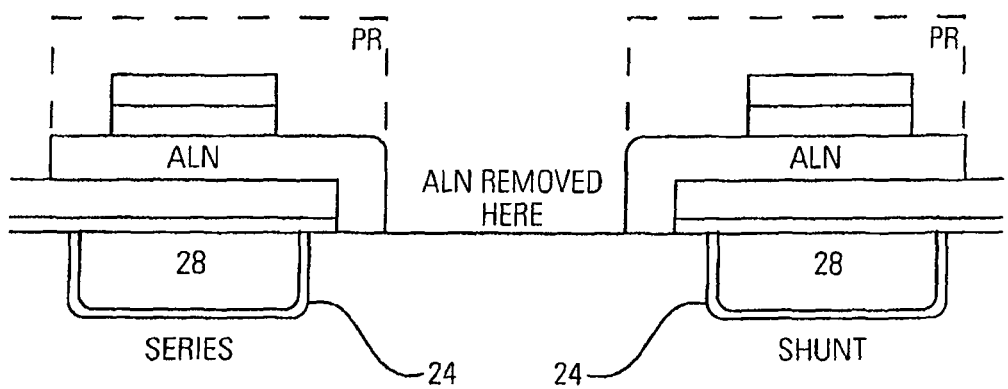
Figure 25:
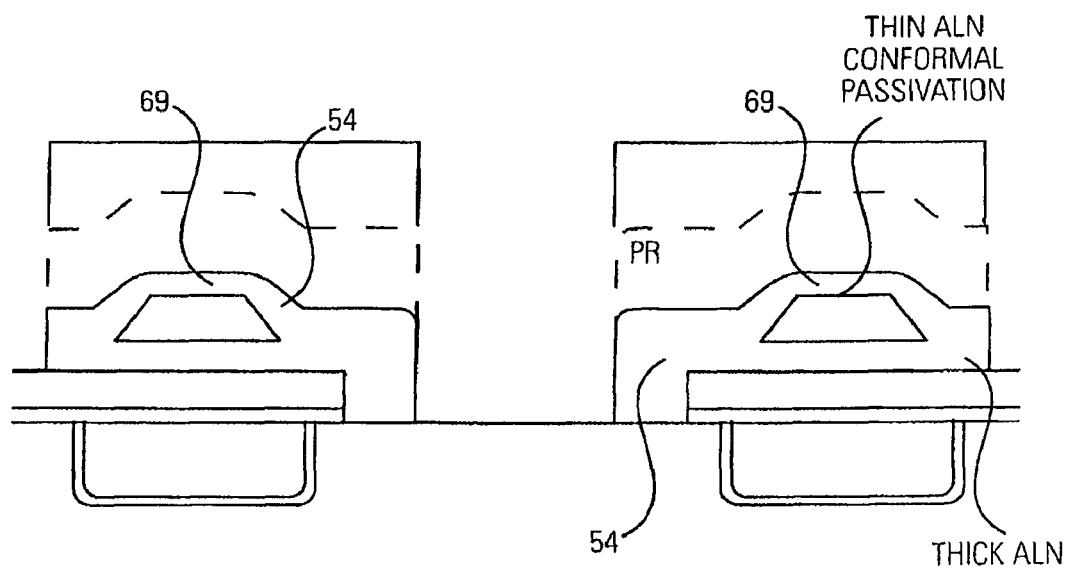

Referring to FIG. 24, a mask (e.g., a photoresist (PR) mask) for use in etching the AlN layer 54 is applied. The mask defines the AlN layer etch and specifies where the AlN is to remain. The mask is preferably a dark field mask that includes positive photo resist. The AlN layer 54 is then etched (e.g., with a dry etch) by utilizing the mask, and the remaining photoresist of the mask is then stripped.

Figure 26:
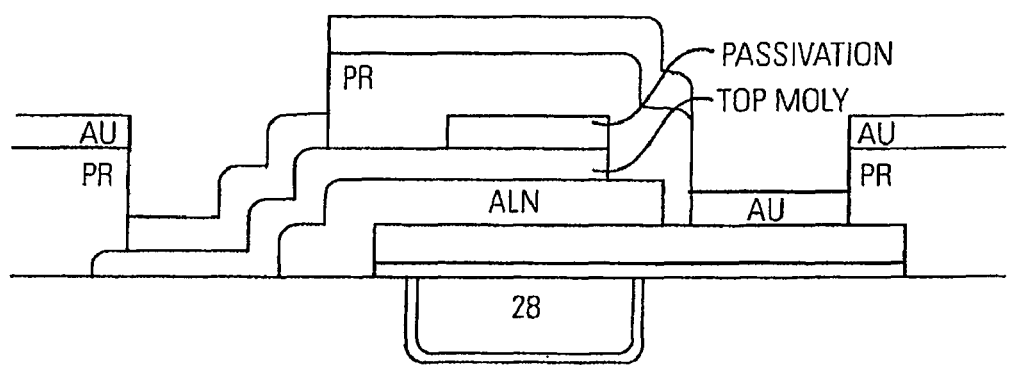
Figure 27:
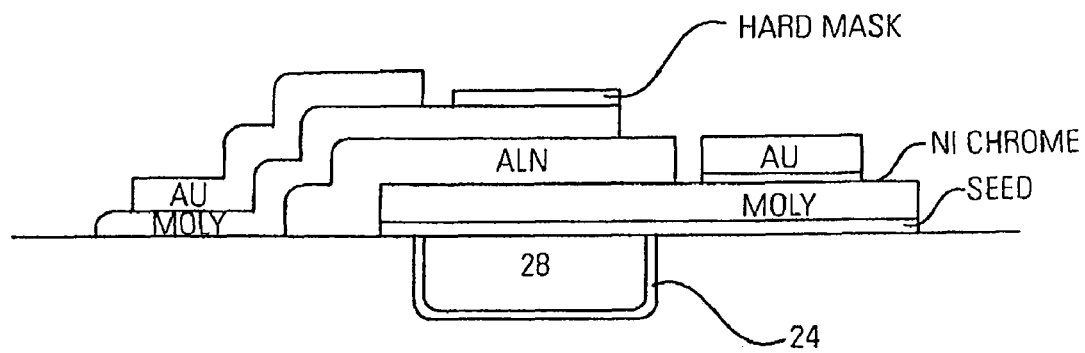
Figure 28:
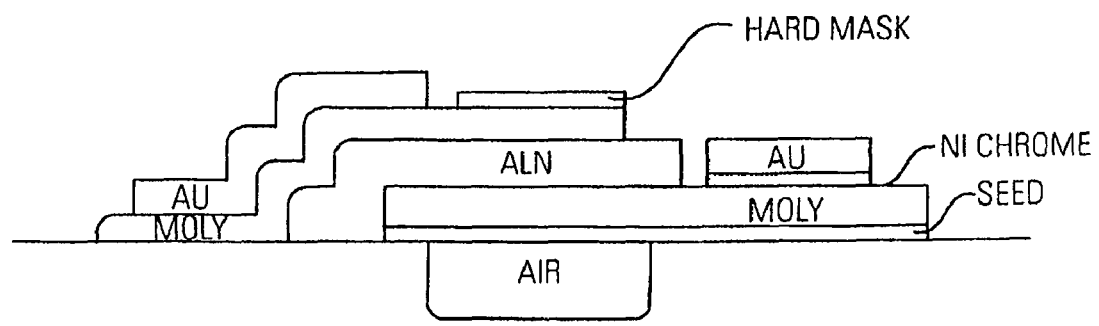

Referring to FIG. 26, a mask for patterning the bond pads and gasket seals is applied. Referring to FIG. 27, NiCr/Au evaporation is performed. The gold is used as the bonding material for the wire bonds used in the die attach. However, gold tends to diffuse into other materials very readily and at low temperatures. To inhibit this, the process, according to the invention, preferably deposits a "barrier" layer. The barrier layer can be, for example, made from TiW, Nickel, Nickel Chrome (or NiCr). This barrier layer is typically between 300 and 1000 Å thick.

Referring to FIG. 27, pad lift-off is performed where metal in the field is lift-off leaving bond pads and gasket contact patterns. Referring again to FIG. 28, the PSG in the swimming pool is then etched away. For example, the wafer may be soaked in a 10:1 HF solution to etch the PSG in the swimming pool. The result of this step is that the FBAR membrane is suspended in air as the PSG is released from the swimming pool.

Conformal Passivation Layer

The conformal passivation layer may be made from AlN and as noted previously serve both as a hard mask and a passivation layer during the processing. It is noted that the conformal passivation layer may be made from other materials, such as TiN, Si3N4, diamond or other materials that makes layer 54 suitable to be both a hard mask and passivation layer. First, the passivation layer (hard mask) are patterned. The passivation layer may be patterned at the same time as the top electrode (e.g., top Mo electrode) is patterned without the need for an additional new mask. Alternatively, the passivation layer can be deposited after the top electrode has been patterned (e.g., after the processing of FIG. 23).

In reactive ion etching (RIE), gases are utilized to etch the Mo layer. The gas $SF_6$ does not attack the AlN. Thus, the AlN is referred to as the "hard mask." Referring to FIG. 25, in an alternative embodiment, the conformal passivation layer is etched at the same time that the AlN layer is etched. For example, the conformal passivation layer may be patterned during the etch of the AlN layer 54.

Various modifications to the present invention will become apparent to those skilled in the art from the foregoing description and accompanying drawings. Accordingly, the present invention is to be limited solely by the scope of the following claims.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

The invention claimed is:

1. A method for fabricating an acoustical resonator on a substrate having a top surface, said method comprising steps of:
    generating a depression in said top surface;
    filling said depression with a sacrificial material, said filled depression having an upper surface level with said top surface of said substrate;
    depositing a first electrode on said upper surface;
    depositing a layer of piezoelectric material on said first electrode;
    depositing a second electrode on said layer of piezoelectric material by employing a mass load lift-off process, wherein the mass load lift-off process further comprises:
    forming a mass-loading pattern over the second electrode, and depositing a mass-loading layer over the second electrode; and
    removing said sacrificial material from said depression.

2. The method of claim 1 wherein the step of depositing a first electrode on said upper surface comprises the steps of:
    depositing a seed layer;
    depositing a conductive material;
    applying a patterned mask;
    etching the conductive material and seed layer in accordance with the patterned mask to form a bottom electrode.

3. The method of claim 1 further comprising:
    depositing a passivation layer for protecting the second electrode.

4. The method of claim 1 wherein said sacrificial material comprises a material chosen from the group consisting of PSG, BPSG, spin-on-glass, polyvinyl, polypropylene and polystyrene.

5. The method of claim 1 wherein said step of filling said depression comprises the steps of:
    depositing a layer of said sacrificial material over said depression;
    planarizing said deposited layer; and
    polishing said planarized layer.

6. The method of claim 1 further comprising the step of providing a layer of an electrically insulating material on the surface of said substrate and depression prior to depositing said layer of sacrificial material, said electrically insulating material preventing a diffusion of elements in said sacrificial material from diffusing into said substrate.

7. The method of claim 1 wherein said first electrode comprises molybdenum.

8. The method of claim 1 wherein said layer of piezoelectric material comprises AlN.

* * * * *